(12) United States Patent
Satoh

(10) Patent No.: US 11,012,060 B2
(45) Date of Patent: May 18, 2021

(54) OFFSET CANCELLATION OF DUTY CYCLE DETECTOR

(71) Applicant: Micron Technology, Inc., Boise, ID (US)

(72) Inventor: Yasuo Satoh, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/784,002

(22) Filed: Feb. 6, 2020

(65) Prior Publication Data

US 2020/0177172 A1 Jun. 4, 2020

Related U.S. Application Data

(62) Division of application No. 16/179,349, filed on Nov. 2, 2018, now Pat. No. 10,601,410.

(51) Int. Cl.
*H03K 5/156* (2006.01)
*H03L 7/18* (2006.01)
*H03K 3/017* (2006.01)
*H03K 5/19* (2006.01)

(52) U.S. Cl.
CPC .......... *H03K 5/1565* (2013.01); *H03K 3/017* (2013.01); *H03K 5/19* (2013.01); *H03L 7/18* (2013.01)

(58) Field of Classification Search
CPC ........ H03K 5/1565; H03K 5/19; H03K 5/125; H03K 3/017; H03L 7/18; G11C 7/22; G11C 11/409
See application file for complete search history.

(56) References Cited

U.S. PATENT DOCUMENTS

| 9,413,339 B2* | 8/2016 | Amirkhany | ............ H03K 3/017 |
| 2016/0182060 A1* | 6/2016 | Im | ............................ H03L 7/08 327/158 |
| 2019/0081619 A1 | 3/2019 | Kim et al. | |

* cited by examiner

*Primary Examiner* — Sibin Chen
(74) *Attorney, Agent, or Firm* — Perkins Coie LLP

(57) ABSTRACT

Several embodiments of electrical circuit devices and systems with a duty cycle correction apparatus that includes a duty cycle adjustment circuit that is configured to adjust a duty cycle of the input clock signal based on an averaged code value. The duty cycle correction apparatus includes a duty cycle detector circuit that receives first and second clock signals from a clock distribution network. The duty cycle detector is configured to output a duty cycle status signal that indicates whether the first clock signal is above or below a 50% duty cycle based on a comparison of the first clock signal to the second clock signal. The duty cycle correction apparatus also includes a counter logic circuit configured to determine the average code value, and the counter logic circuit automatically cancels an offset of the duty cycle detector when determining the averaged code value.

17 Claims, 8 Drawing Sheets

| CODE | BIT 4 | BIT 3 | BIT 2 | BIT 1 | BIT 0 |
|---|---|---|---|---|---|
| Selected Pull-Up Circuits ON | 1 | 1 | 1 | 1 | 1 |
|  | 1 | 1 | 1 | 1 | 0 |
|  | 1 | 1 | 1 | 0 | 1 |
|  | ... | ... | ... | ... | ... |
|  | 1 | 0 | 0 | 0 | 0 |
| Selected Pull-Down Circuits ON | 0 | 1 | 1 | 1 | 1 |
|  | ... | ... | ... | ... | ... |
|  | 0 | 0 | 0 | 1 | 0 |
|  | 0 | 0 | 0 | 0 | 1 |
|  | 0 | 0 | 0 | 0 | 0 |

OFFSET CANCELLATION OF DUTY CYCLE DETECTOR

CROSS-REFERENCE TO RELATED APPLICATION(S)

This application is a division of U.S. patent application Ser. No. 16/179,349, filed Nov. 2, 2018; which is incorporated herein by reference in its entirety.

TECHNICAL FIELD

The disclosed embodiments relate to electrical circuit devices and systems, and, in particular, to electrical circuit devices having duty cycle detector circuitry.

BACKGROUND

Clock signals are used to coordinate actions of electrical circuits in an electrical circuit device. However, the duty cycle of these clock signals can be subject to distortion. A duty cycle of a clock signal is a ratio of the pulse time of the clock signal to its cycle period. A duty cycle of a clock signal can become distorted due to a variety of sources, including amplifiers that make up a clock tree, large propagation distances between amplifier stages of the clock tree, and/or parasitic conductor capacitance. Distortion of the duty cycle skews timing margins defined by the clock signal in electrical circuit devices. As a result, an electrical circuit using the distorted clock signal can have smaller timing windows in which to transfer and/or process data, which could lead to reduced pulse widths, data errors, and unreliable circuit performance. As input/output speeds increase (e.g., as the cycles of a clock signal are reduced), it also becomes increasingly more challenging to reduce duty cycle distortion, meaning that the consequences of duty cycle distortion at high input/output speeds are even more apparent. In addition, electrical circuits at different locations (e.g., on different electrical circuit dies) can experience varying degrees of duty cycle distortion of a clock signal due to differing sources of distortion located along the corresponding clock branches of a clock tree that define the clock signal pathways.

One or more duty cycle detectors (DCD) can be used in one or more locations of the electrical circuit device to detect distortions in the duty cycle of the clock signals. However, the DCD circuit can have an offset error (also referred to herein as "DCD offset") due to offsets in components in the DCD circuit such as the reference clock path, the charge-discharge circuits, amplifier circuit, and comparator circuit. Thus, the output of the duty cycle detector can be based on both the DCD offset and the distortions in the duty cycle of the clock signals. When the DCD circuit has an offset error, it can be difficult to correct for the distortions in the duty cycle of the clock signal. For example, if the duty cycle distortions require a +3 adjustment correction and the DCD circuit has an offset error of +2, the adjustment to the duty cycle of the clock signal could end up being +5 instead of +3. In conventional circuits, a DCD circuit calibration could be performed to determine a trim value, known as a time output high (tOH) trim, to cancel the DCD offset. However, in some applications it may be difficult to directly sense the duty cycle of the clock signal at its source to perform the DCD circuit calibration.

BRIEF DESCRIPTION OF THE DRAWINGS

FIG. 5 illustrates a Table showing an exemplary five-bit code that corresponds to the duty cycle adjuster of FIG. 3.

DETAILED DESCRIPTION

As described in greater detail below, the present technology relates to electrical circuit devices and related systems having duty cycle detector circuitry. Electrical apparatuses (e.g., electrical circuit devices) configured in accordance with embodiments of the present technology can include structures such as, for example, storage media, and/or other devices employing single or differential clock signals. For example, apparatuses in accordance with embodiments of the present technology can include dynamic random access memory (DRAM) including DDR3, DDR4, DDR5, high bandwidth memory (HBM) having DRAM, NOR, PCM, RRAM, MRAM, read only memory (ROM), erasable programmable ROM (EPROM), electrically erasable programmable ROM (EEPROM), ferroelectric, and other storage media, including volatile storage media. The apparatuses can be configured to operate as memory storage devices having memory regions (e.g., NAND memory regions), logic gates, timers, counters, latches, shift registers, microcontrollers, microprocessors, field programmable gate arrays (FPGAs), sensors, and/or other integrated circuitry. The apparatuses can also include other circuit components, such as multiplexers, decoders, buffers, read/write drivers, address registers, data out/data in registers, etc., for accessing and/or processing data and other functionality, such as, for example, programming memory cells of a memory region and/or communicating with controllers and/or host devices.

One embodiment of the present technology is an apparatus (e.g., a storage device) that comprises duty cycle calibration (DCC) circuit and utilizes a clock signal (e.g., a single or differential clock signal). The DCC circuit includes a DCD circuit that is configured to detect distortions in a duty cycle of a system clock signal that is generated based on an input clock signal (e.g., a signal from the source clock). The DCC circuit includes a duty cycle adjuster (DCA) circuit that is configured to adjust the input clock signal to mitigate any duty cycle distortions detected in the system clock signal. In exemplary embodiments of the present disclosure, the DCC circuitry is configured to cancel (e.g., automatically) a DCD offset of the DCD circuit without recalibration of the DCD circuit and/or without having to update a DCD trim (e.g., a tOH trim), if used. The system clock signal used by the DCD circuit can be sensed at any point in the clock distribution network such as, for example, the closest sensing nodes to the DCD circuit. A person skilled in the art will understand that the technology described below can have additional embodiments and that the technology may be practiced without several of the details of the embodiments described below with reference to FIGS. 1-8.

Figure 1:
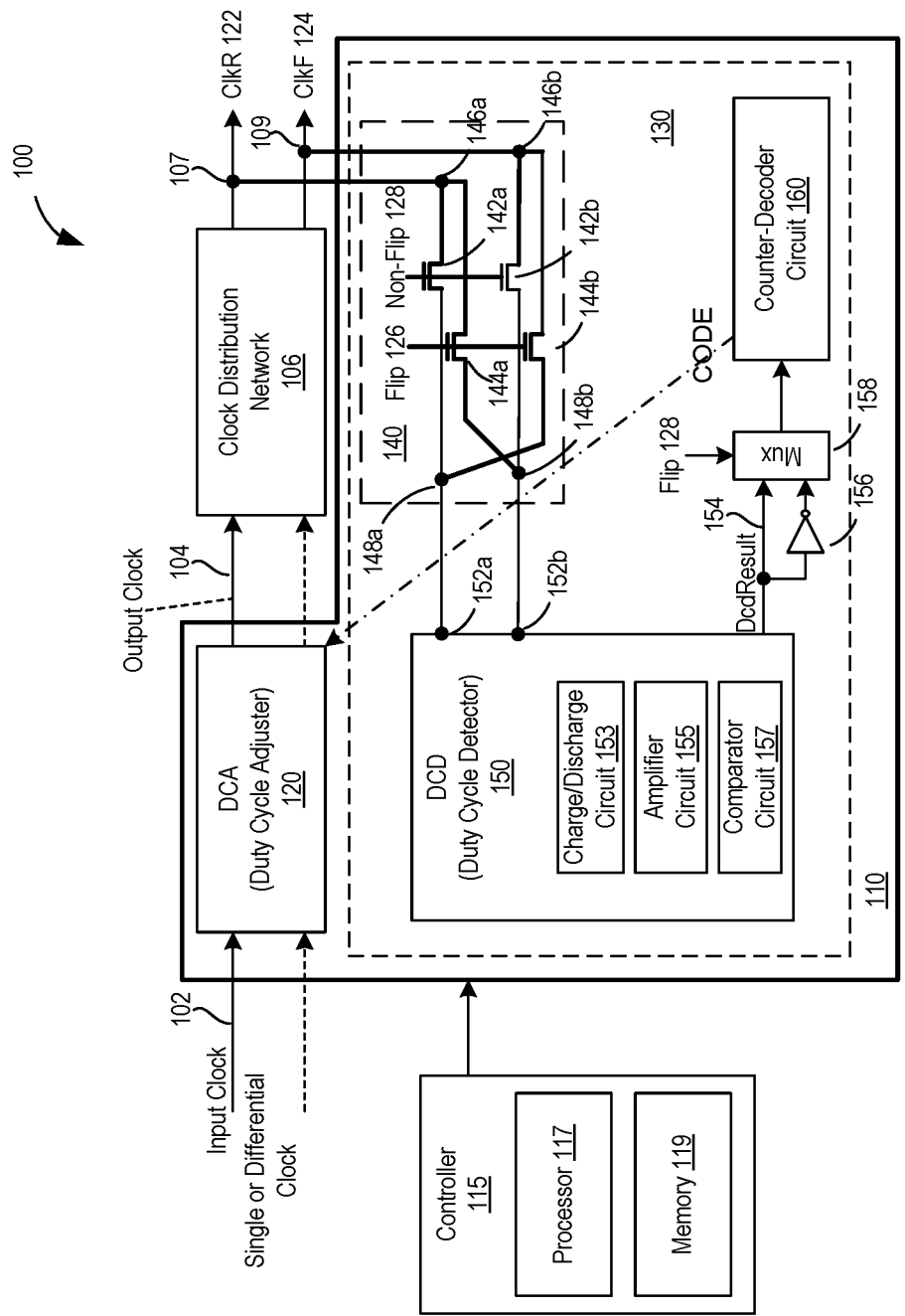
FIG. 1 is a block diagram of an apparatus having a duty cycle corrector configured in accordance with an embodiment of the present technology.

FIG. 1 is a block diagram of certain components of an apparatus 100, which can be, for example, storage media (e.g., DRAM, an HBM, etc.) or a component thereof. The apparatus 100 includes a DCC circuit 110 that can be operated by controller 115. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 can include an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example apparatus 100 in FIG. 1 has been illustrated as including the controller 115, in another embodiment of the present disclosure, an apparatus 100 may not include a controller 115, and can instead rely upon external control (e.g., provided by an external host, or by a processor or controller separate from the memory sub-system).

The DCC circuit 110 includes a DCA 120 that receives an input clock signal 102, which is generated by a clock generator (not shown), and outputs a system clock signal 104. The input clock signal 102 can be an internally or an externally supplied clock signal (e.g., provided by an external host, or by a processor or controller separate from the DCC 110 and/or apparatus 100). In other embodiments, the clock signal can be partially generated and/or partially supplied externally and partially generated and/or partially supplied by circuitry located on the apparatus 100. The input clock signal 102 can be a single-ended or a differential clock signal. In some embodiments, the input clock signal 102 can be a single-ended clock signal with a phase splitter to generate a differential clock signal as the output clock signal 104 in, for example, the DCA circuit 120, the clock distribution network 106, or some other place in the apparatus 100.

The system clock signal 104 from the DCA 120 is transmitted to the clock distribution network 106, which can include a clock tree that distributes the system clock signal 104 to coordinate the actions of electrical circuits connected to the clock distribution network 106. The nodes 107 and 109 can be points in the clock distribution network 106 where clock signals corresponding to the system clock signal 104 and a signal complementary to the system clock signal 104 can be sensed. For example, node 107 can correspond to clock signal clkR 122, which is a clock signal that corresponds to the system clock signal 104 (e.g., is in phase (or generally in phase) with the system clock signal 104). The node 109 can correspond to clock signal clkF 124, which is a clock signal that is complementary to that of clkR 122 and the system clock signal 104 (e.g., clkF can be 180 deg. out-of-phase (or generally 180 deg. out-of-phase) with the system clock signal 104).

The DCC circuit 110 can also include a duty cycle detector component 130 that receives one or both clock signals clkR 122 and clkF 124. As discussed below, the DCD component 130 can be configured to detect distortions in the duty cycle of clkR 122 and/or the duty cycle of clkF 124 and provide information to the DCA 120 for adjusting the input clock 102. The clock signals clkR 122 and clkF 124 can be sensed from any point in the clock distribution network 106. For example, in some embodiments, the clock signals clkR 122 and clkF 124 are sensed from nodes 107 and 109, respectively, which can represent sensing points that are the closest sensing points to the DCD component 130.

The DCD component 130 can include a switching circuit 140 that receives clock signals clkR 122 and clkF 124 and outputs the signals to the DCD circuit 150. The switching circuit 140 can be configured to receive the clock signals clkR 122 and clkF 124 at input connections 146a and 146b, respectively, and transmit the clock signals from output connections 148a and 148b in an order based on the configuration of switches 142a,b and 144a,b. In an initial mode of operation for the DCD component 130 (hereinafter referred to as "initial mode" or "non-flipped mode"), clkR 122 is transmitted to input connection 152a and clkF 124 is transmitted to 152b. In a flipped mode of operation for the DCD component 130 (hereinafter referred to as "flip mode" or "flipped mode"), clkR 122 is transmitted to input connection 152b and clkF 124 is transmitted to 152a. In some embodiments, a flip signal 126 determines whether the DCC circuit 110 is an initial mode of operation or a flipped mode of operation. For example, a non-flipped mode of operation can be represented by a logic 0 on the flip signal 126, and a flipped mode of operation can be represented by a logic 1 on the flip signal 126. In some embodiments, the switches 142a,b and 144a,b are operated based on the flip signal 126. To operate the switching circuit 140, the flip signal 126 and an inverse of the flip signal 126 via a non-flip signal 128 are sent to the gate connections of switches 144a,b and switches 142a,b, respectively. In the initial mode, the flip signal 126 is off (e.g., a logic 0) and the non-flip signal 128 is on (e.g., a logic 1), which means that switches 144a,b are OFF and switches 142a,b are turned ON. With switches 142a,b ON, the clock signals clkR 122 and clkF 124 are routed from input connections 146a and 146b to output connections 148a and 148b, respectively. In the flipped mode of operation, the switches 144a,b are turned ON by the flip signal 126 (e.g., logic 1) and switches 142a,b are OFF by the non-flip signal 128 (e.g., logic 0). With switches 144a,b ON, the clock signals clkR 122 and clkF 124 are routed from input connections 146a and 146b to output connections 148b and 148a, respectively.

The DCD circuit 150 receives the clock signals clkR 122 and clkF 124 output from the switching circuit 140 at input connections 152a,b. The DCD circuit 150 analyzes the clock signals clkR 122 and clkF 124 and determines whether the duty cycle of the clock signal is above 50% or below 50%. The DCD circuit 150 can be a conventional duty cycle detector circuit that includes, for example, charge/discharge circuits 153, amplifier circuits 155, and comparator circuits 157. Because those skilled in the art understand the operation of the DCD circuit 150, for brevity, a detailed explanation of its operation is not provided except as needed to explain the present technology.

In some embodiments, the DCD circuit 150 is configured such that the duty cycle of the clock signal at input connection 152a is analyzed to determine whether the duty cycle ratio is above 50% or below 50% based on a comparison with the clock signal at input connection 152b. The result of the duty cycle analysis can be transmitted from the DCD circuit 150 to counter-decoder circuit 160 for further processing. For example, in the initial mode of operation, the DCD circuit 150 receives the clock signal clkR 122 at input connection 152*a* and the complementary clock signal clkF 124 at input connection 152*b*. Based on the analysis of clock signal clkR 122, which includes a comparison to the clock signal clkF 124, the DCD circuit 150 outputs a signal DcdResult 154 that indicates whether clock signal clkR 122 is above 50% or below 50%. For example, if clkR 122 is above 50% duty cycle, DcdResult 154 can be a logic 1, and if the duty cycle of clkR 122 is under 50% DcdResult 154 can be a logic 0.

The DcdResult 154 signal is sent to counter-decoder circuit 160 via multiplexer 158. The counter-decoder circuit 160 generates and/or updates a code value (hereinafter "CODE") based on the value of DcdResult 154. The generation/update of the CODE can include, at least in part, incrementing and/or decrementing a count value in up/down counter 210 (see FIG. 2). For example, if DcdResult 154 is a logic 1, then the count value is incremented by one, and if DcdResult 154 is a logic 0, then the count value is decremented by one. The CODE is generated/updated by the counter-decoder 160 and transmitted to the DCA 120 for use in adjusting the duty cycle of input clock signal 102 to generate the system clock 104. Thus, in the initial mode of operation for DCD component 130, the duty cycle of clkR 122 is checked for distortions based on clock signal clkF 124, the CODE from counter-decoder 160 is generated and/or updated based on the results of the duty cycle distortion check for clkR 122, and the duty cycle of the input clock signal 102 is adjusted based on the CODE.

As discussed below, upon startup of the apparatus 100, the controller 115 sends a start signal (also referred to herein as "DCC start") to the DCC 110. The DCC circuit 110 is in an initial mode of operation when "searching" for the CODE that mitigates the duty cycle distortions. The "search" (also referred to herein as "DCC search") includes an iterative process of detecting distortions in the duty cycle of clkR 122, generating/updating the CODE, and adjusting the duty cycle of the input clock signal 102 based on the CODE until the DcdResult 154 signal sequence starts to alternate (or dither) between "1" and "0." For example, an exemplary DcdResult 154 signal sequence from the DCD circuit 150 can be "1111 . . . 0101" or a sequence such as "0000 . . . 1010." The DcdResult 154 signal sequence starts to dither when the duty cycle of clkR 122 is detected to be 50%±a predetermined deadband. In some embodiments, when the DcdResult 154 signal sequence reaches a dither condition, the DCC search is deemed to be completed and the updating of the CODE is locked (also referred to herein as "DCC lock"). If the DCD circuit 150 has maintained its calibration (e.g., the DCD offset is zero), the CODE value at DCC lock corresponds to the adjustment needed for the system clock signal 104 to have a duty cycle of 50% percent±a predetermined deadband. However, as discussed above, if the DCD circuit 150 is uncalibrated or if the calibration has drifted, the DCD circuit 150 can have a DCD offset due to, for example, offsets in the charge/discharge circuits 153, amplifier circuits 155, and comparator circuits 157. If there is a DCD offset, the CODE used by the DCA circuit 120 for correcting distortions in the system clock signal 104 can be incorrect. For example, if a properly calibrated DCD circuit 150 causes the DCC circuit 110 to generate a CODE of +3, an uncalibrated DCD circuit 150 having, for example, a DCD offset of +2 will cause the DCC circuit 110 to generate a CODE of +5 instead of +3, which means that the DCA circuit 120 will adjust the duty cycle of input clock 102 to a value other than 50%.

To cancel or mitigate the DCD offset from the final CODE value used by the DCA circuit 120 during in-service operation, exemplary embodiments of the present technology perform two DCC searches during an initial start-up sequence of the apparatus 100. A first DCC search (also referred to herein as "initial DCC search" or "initial search") is performed by the DCC circuit 110, as discussed above. Once the CODE from the first DCC search is determined (herein after "initial CODE"), a second DCC search is performed that generates a second CODE. In some embodiments, the second DCC search can be performed automatically. In other embodiments, the second DCC search can be initiated manually (e.g., by a user). Prior to the start of the second DCC search, the initial CODE from the initial DCC search is stored for later retrieval, as discussed below. The second DCC search is similar to the first search. However, in the second DCC search, the DCC circuit 110 is operated in a flipped mode of operation (the second DCC search is also referred to herein as "flipped DCC search" or "flipped search" and the second CODE is referred to herein as "flipped CODE").

As discussed above, the DCD circuit 150 is configured such that the duty cycle of the clock signal at input connection 152*a* is analyzed to determine whether the duty cycle is above 50% or below 50% based on a comparison with the clock signal at input connection 152*b*. In the flipped mode of operation, the DCD circuit 150 receives the complementary clock signal clkF 124 at input connection 152*a* and the clock signal clkR 122 at input connection 152*b*. Based on the analysis of complementary clock signal clkF 124, which includes a comparison to the clock signal clkR 122, the DCD circuit 150 outputs a DcdResult signal 154 that indicates whether the duty cycle of the complementary clock signal clkF 122 is above 50% or below 50%. For example, if clkF 124 is above 50% duty cycle, DcdResult signal 154 can be a logic 1, and if the duty cycle of clkF 124 is under 50%, DcdResult signal 154 can be a logic 0. However, unlike the initial operation mode, in the flipped operation mode, the DcdResult signal 154 is inverted via inverter 156 and the inverted DcdResult signal 154 is selected by multiplexer 158 prior to outputting the inverted DcdResult signal 154 to the counter-decoder circuit 160. The flipped DCC search is performed until the DcdResult signal 154 reaches a dither condition and a second DCC lock fixes the flipped CODE.

Figure 2:
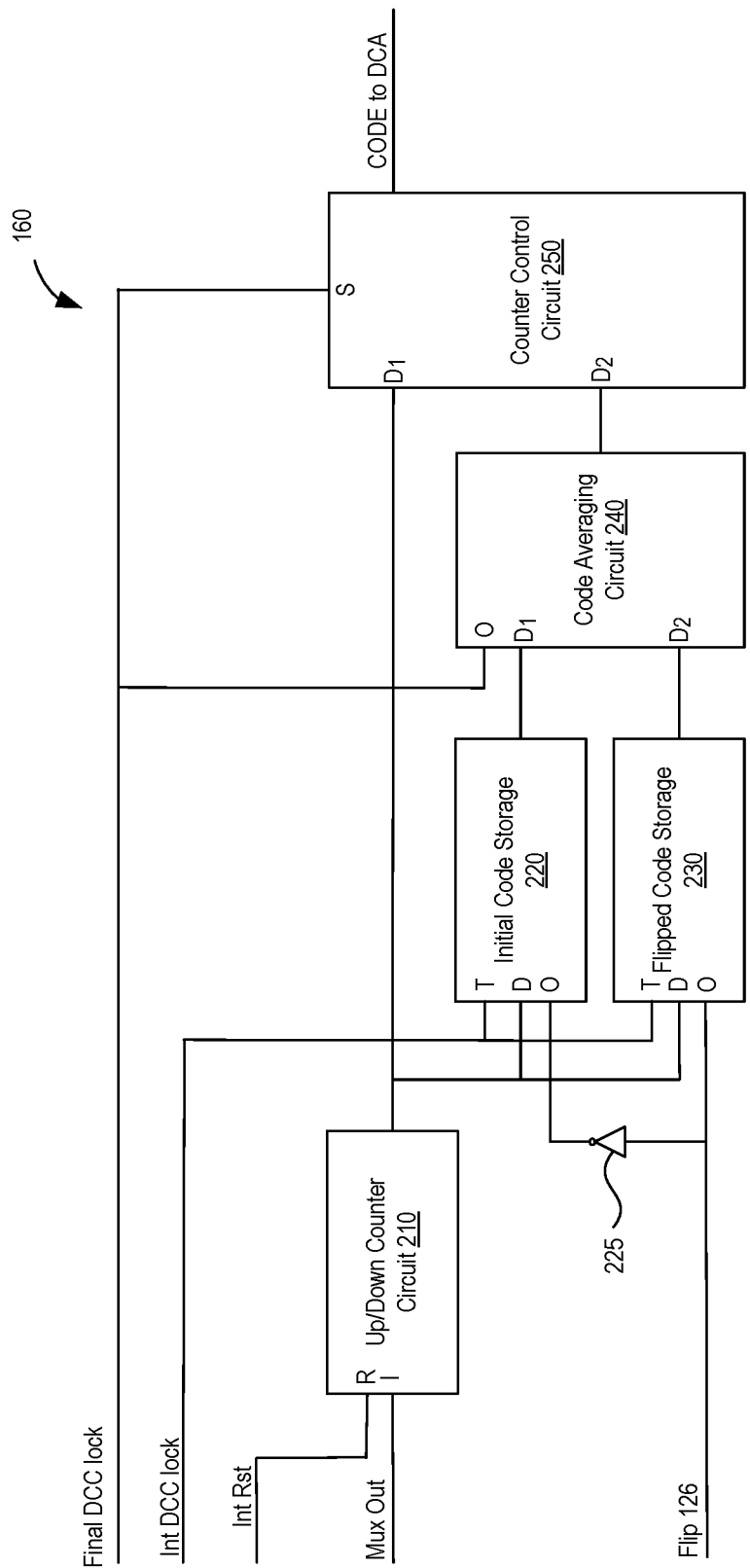
FIG. 2 is a block diagram of a counter-decoder in accordance with an embodiment of the present technology.

FIG. 2 illustrates an exemplary embodiment of a counter-decoder circuit 160. The counter-decoder circuit 160 includes an up/down counter 210 for incrementing and decrementing the counter value during the DCC search. The counter value is used to determine the CODE (e.g., initial CODE, flipped CODE, or final CODE (discussed below)). In some embodiments, the CODE can be in the form of a binary value such as, for example, a four-bit value in a rage of 0000 to 1111. The number of bits provide the step-wise adjustments that can be made by the DCA circuit 120. For example, a four-bit code provides for 16 (0000 to 1111) adjustment increments or steps for the duty cycle ratio. In some embodiment, the adjustments for decreasing the duty cycle ratio and the adjustments for increasing the duty cycle can be done independently. In some embodiments, as discussed below, a five-bit count can be used to provide a 16-step adjustment with the most significant bit corresponding to whether a pull-up circuit or a pull-down circuit (discussed below) of the DCA circuit 120 should be operated. Of course, the number of code bits and thus the incremental step-wise adjustment can vary depending on the configuration of the DCA circuit 120.

As seen in FIG. 2, the up/down counter 210 receives the signal from the multiplexer 158 and, during the DCC search (e.g., initial or flipped), increments or decrements the value in the up/down counter 210 based on the value of the output from the multiplexer. During the DCC search (e.g., initial or flipped), the counter control logic 250 receives the value from the up/down counter 210 at input D1. With DCC Lock set at, for example, a logic 0, the counter control logic 250 transfers the data at input D1, which is a CODE value from up/down counter 210, to the DCA circuit 120 and/or allows the DCA circuit 120 to access the CODE value in the counter-decoder 160 for use in adjusting the duty cycle of input clock signal 102. Until DCC Lock (e.g., Int DCC Lock or final DCC Lock) is achieved, the CODE value in the up/down counter 210 is updated as part of the iterations of the DCC search. As explained in detail below, once the DCC search is completed and DCC Lock (e.g., Int DCC Lock or final DCC Lock) is achieved, the CODE is stored in initial code storage 220 or flipped code storage 230 depending on whether the DCC search is the initial search or the flipped search. After the DCC searches are completed, the final DCC Lock is set at, for example, a logic 1, and the code averaging circuit 240 reads the values in the storages 220 and 230 and calculates an average code value (referred to herein as "average CODE" or "final CODE"). Once calculated, the counter control logic 250 receives the final CODE at input D2. With the final DCC Lock at a logic 1, the counter control logic 250 transfers the data at D2, which is the final CODE from code averaging circuit 240, to the DCA circuit 120 and/or allows the DCA circuit 120 to access the final CODE in the code calculating circuit 240 for use in adjusting the duty cycle of input clock signal 102.

Figure 3:
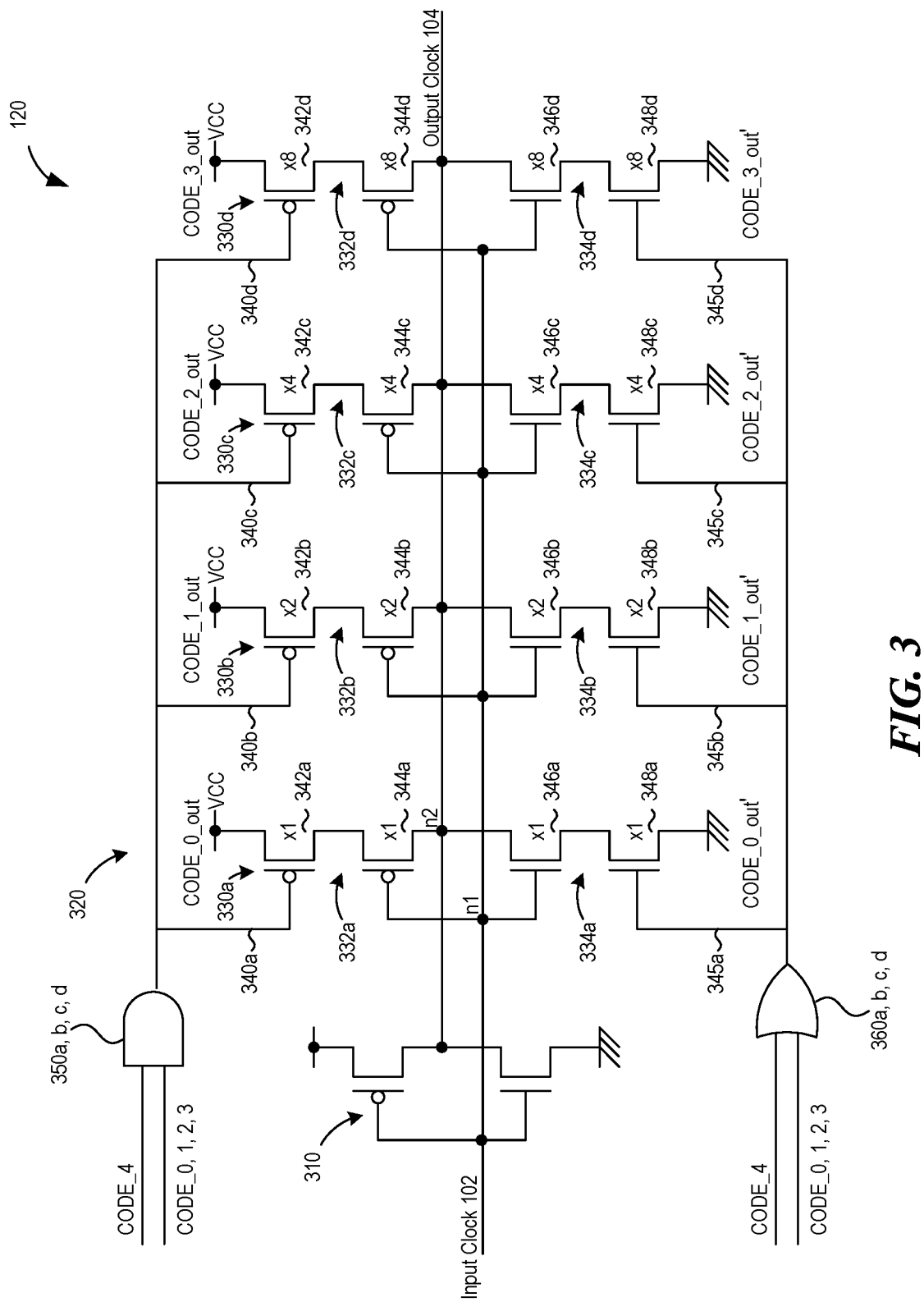
FIG. 3 is a block diagram of a portion of a duty cycle adjuster circuit in accordance with another embodiment of the present technology.
Figure 4:
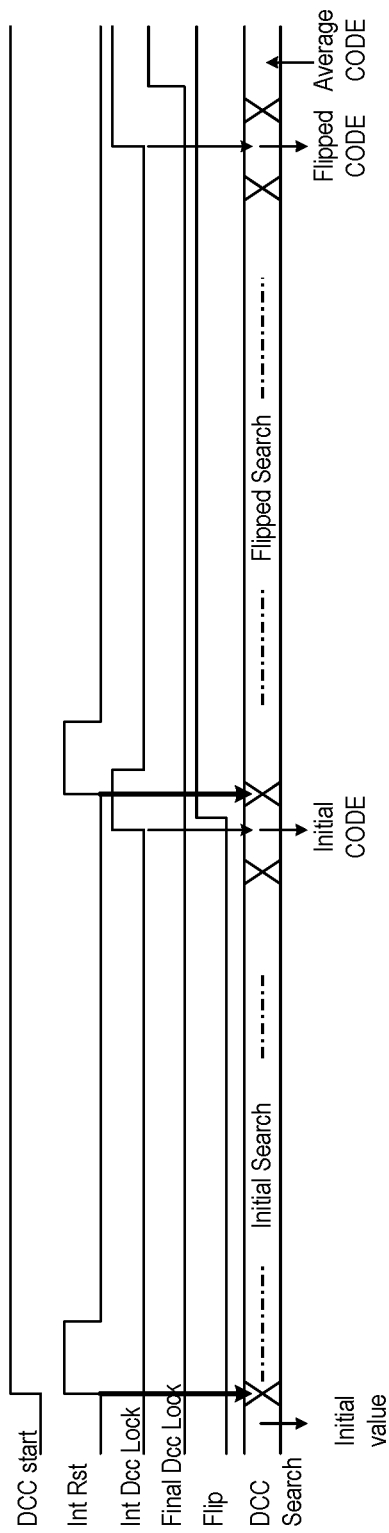
FIG. 4 is a portion of a timing diagram of control signals used in the operation of the duty cycle corrector of FIG. 1.

FIG. 3 illustrates a simplified schematic of the DCA circuit 120. The DCA circuit 120 includes an inverter 310 that receives the input clock signal 102 and outputs an inverted clock signal that is 180 deg. out-of-phase from the input clock signal 102. In some embodiments, the inverter 310 and the transition delay circuit 320 are coupled in parallel and the output from the inverter 310 can be transmitted to the transition delay circuit 320 that is configured to adjust the duty cycle, if needed, based on the code. The output of the transition delay circuit 320 is the system clock signal 104. In some embodiments, a second clocked inverter can be added either after inverter 310 or the transition delay circuit 320 to have the system clock signal 104 in-phase with the input clock signal 102.

The transition delay circuit 320 includes one or more transition delay circuits that delay the rising edge and/or the falling edge of the clock input signal to adjust the duty cycle. For example, as illustrated in FIG. 3, the transition delay circuit 320 includes transition delay circuit 330a-330d, which are connected in parallel. The transition delay circuits 330a-330d have a similar circuit configuration, and the transition delay circuit 330a is described as an example. The clocked inverter 330a includes P-channel transistors 342a and 344a and N-channel transistors 346a and 348a, which are connected in series. A source of the P-channel transistor 342a is connected to a power supply line VCC that is supplied and a source of the N-channel transistor 348a is connected to a power supply line having a ground potential VSS. Gate electrodes of the P-channel transistor 344a and the N-channel transistor 346a are commonly connected and function as an input node n1 to which the input clock signal 102 is supplied. Furthermore, drains of the P-channel transistor 344a and the N-channel transistor 346a are commonly connected and function as an output node n2 from which the system clock signal 104 is provided. If a polarity of the system clock signal 104 is required to be aligned to a polarity of the input clock signal 102, an additional inverter (not depicted) receiving the system clock signal 104 can be added.

A gate electrode of the P-channel transistor 342a receives a control signal 340a which corresponds to a bit-portion of the CODE. The control signal 340a is set to a low level whenever bit 0 of the CODE and/or bit 4 of the CODE are "0" via the AND gate 350a. Similarly, control signal 340b is set to a low level whenever bit 1 of the CODE and/or bit 4 of the CODE are "0", control signal 340c is set to a low level whenever bit 2 of the CODE and/or bit 4 of the CODE are "0", and control signal 340d is set to a low level whenever bit 3 of the CODE and/or bit 4 of the CODE are "0." FIG. 5 illustrates a Table of an exemplary five-bit code corresponding to the DCA circuit 120 of FIG. 3. When the control signal 340a is set to a low level, the clocked inverter 330a is activated to pull up the output node n2 based on a level of the input node n1. When the control signal 340a is set to a high level via the AND gate 350a, the clocked invertor 330a is stopped and unable to pull up the output node n2. Thus, the series-connected transistors 342a and 344a function as a pull-up circuit 332a that is selectively activated by the control signal 340a. The other pull-up circuits 332b-d are similarly operated by control signals 340b-d via AND gates 350b-d, respectively.

Similarly, a gate electrode of the N-channel transistor 348a receives a control signal 345a which corresponds to a portion of the code. The control signal 345a is set to a high level whenever bit 0 of the CODE or bit 4 of the CODE are "1" via the OR gate 360a. Similarly, control signal 345b is set to a high level whenever bit 1 of the CODE or bit 4 of the CODE are "1," control signal 345c is set to a high level whenever bit 2 of the CODE or bit 4 of the CODE are "1," control signal 345d is set to a high level whenever bit 3 of the CODE or bit 4 of the CODE are "1." When the control signal 345a is set to a high level, the clocked inverter 330a is activated to pull down the output node n2 based on the level of the input node n1. When the control signal 345a is set to a low level, the clocked invertor 330a is stopped and unable to pull down the output node n2. Thus, the series-connected transistors 348a and 346a function as a pull-down circuit 334a that is selectively activated by the control signal 345a. The other pull-down circuits 334b-d are similarly operated by control signals 345b-d via OR gates 360b-d, respectively.

As described above, the clocked inverters 330a-d are able to control the corresponding pull-up circuits 332a-d and the pull-down circuit 334a-d independently. The DCA circuit 120 is configured to receive the binary CODE from the counter-decoder 160 and adjust the operation of the transition delay circuit 330 based on the received CODE (e.g., initial CODE, flipped CODE, or final CODE). In some embodiments, as seen in FIG. 5, the CODE can be five-bit code ranging from 00000 to 11111 with the most significant bit used to determine which of the pull-up circuit 332a-d or the pull-down circuit 334a-d are selectively controlled using the remaining four bits of the CODE. For example, a "0" on bit 4 means that transistors 342a to 342d are ON and the pull-down circuits 334a to 334d can be selective operated based on the value of the remaining four bits of the CODE. If bit 4 is a "1", the transistors 348a to 348d are ON and the pull-up circuits 332a to 332d can be selective operated based on the value of the remaining four bits of the CODE.

In some embodiments, driving capabilities of the clocked inverters 330a, 330b, 330c, and 330d may be designed to have power-of-two weights. For example, when the clocked inverter 330a has a driving capability of 1×, the driving capabilities of the clocked inverters 330b, 330c and 330d are 2×, 4× and 8×, respectively. Thus, pull-up capability can be controlled to a resolution of sixteen steps corresponding "0000" to "1111" (with bit 4 at a "1") by control signals 340a, 340b, 340c and 340d. In operation, the number of transition delay circuits 330a-d that have their respective transistors 342a-d ON (control signal 340a-d low) determines the speed of the rising edge transitions of the clock signal. The greater the number of transistors 342a-d ON means that the rising edge transitions of the clock signal are faster. Conversely, the fewer the number of transistors 342a-d ON means that the rising edge transitions of the clock signal are delayed.

Similarly, pull-down capability can be controlled to a resolution of sixteen steps corresponding to "0000" to "1111" (with bit 4 at a "0") by control signals 345a, 345b, 345c and 345d. In operation, the number of transition delay circuits 330a-d that have their respective transistors 348a-d ON (control signal 345a-d high) determines the speed of the falling edge transitions of the clock signal. The greater the number of transistors 348a-d ON means that the falling edge transitions of the clock signal are faster. Conversely, the fewer number of transistors 348a-d ON means that the falling edge transitions of the clock signal are delayed. Of course, those skilled in the art understand that other configurations of the DCA circuit 120 are possible.

An exemplary operation of the DCC circuit 110 is discussed with reference to FIG. 1-4. When the apparatus 100 is turned on, the apparatus 100 sends a DCC start signal (see FIG. 4) to initiate startup of the DCC circuit 110 (e.g., as part of the initial startup sequence of the apparatus 100). When turned on, the DCC circuit 110 sends an internal reset signal ("Int Rst") pulse (e.g., a logic 1 pulse) to the counter-decoder 160 to reset the count in up/down counter to a predetermined value such as, for example, "01111" or "10000" or some other initial value. In addition, the intermediate DCC lock ("Int DCC lock") and the final DCC lock ("Final DCC Lock") are set to a logic 0 indicating that initial and flipped CODES have not yet been determined. Further, when the DCC circuit 110 is turned on, an initial DCC search is initiated to determine the initial or non-flipped CODE using the iterative process of detecting distortions in the duty cycle of clkR 122, updating the initial CODE, and using the DCA circuit 120 to adjust the duty cycle of the input clock signal 102 based on the initial CODE until the DcdResult 154 signal starts to dither, as discussed above. During the iterative process of the initial DCC search, the up/down counter 210 is incremented or decremented based on the value of the DcdResult 154 signal. For example, if the initial value of the up/down counter is "01111" and the DcdResult 154 signal is a "1" indicating, for example, a duty cycle ratio greater than 50%, the count in up/down counter 210 is increased to "10000." The "10000" count is then transferred to and/or read by the DCA circuit 120 via the counter control logic 250 as the CODE value for the DCA circuit 120 to use. In the DCA circuit 120, a value of "10000" means that transistors 348a-d of transition delay circuits 330a-d are ON all the time due to the most significant bit being a "1," and the pull-up circuits 352a-d are selectively turned on based on the value of the remaining four-bits. In this case with a value of "0000," the pull-up circuits 352a-d are ON. If the DcdResult 154 signal is "0" indicating, for example, a duty cycle ratio less than 50%, the count in up/down counter 210 is decreased to "01110" from the initial value of "01111." The "01110" count is then transferred to and/or read by the DCA circuit 120 via the counter control logic as the CODE value. In the DCA circuit 120, a value of "01110" means that transistors 342a-d of transition delay circuits 330a-d are ON due to the most significant bit being a "0," and the pull-down circuits 354a-d are selectively turned on based on the value of the remaining four-bits. In this case with a value of "1110," the pull-down circuits 352a-c are ON and pull-down circuit 352d is OFF.

Once the initial DCC search reaches a dither condition on the DcdResult 154 signal, the Int DCC lock signal goes to, for example, logic 1 to enable the transfer of the count value in up/down counter 210 to the initial code storage 220, which stores the initial CODE. As seen in FIG. 2, the Int DCC Lock signal is connected to the transfer T input of the initial code storage 220. The flip signal is connected to the operate input O on the initial code storage 220 via inverter 225. With the DCC circuit 110 in the initial operation mode, the flip signal is at, for example, a logic 0. Thus, a logic 1 is provided at the operate input O via inverter 225 to enable operation of the initial code storage 220. In addition, the flipped code storage 230 is disabled because the logic 0 of the flip signal is sent to the operate input O of flipped code storage 230. When the dither condition on the DcdResult 154 signal occurs for the initial DCC search, the Int DCC Lock is set to, for example, a logic 1 to lock in the initial CODE by enabling transfer of the initial CODE from the up/down counter 210 to the initial code storage 220 via input D.

When the initial CODE is stored in the initial code storage 220, the flip signal is set to, for example, a logic 1 to enable operation of the flipped code storage 230 and disable operation of the initial code storage 220, and another Int Rst pulse (e.g., a logic 1 pulse) is sent to the counter-decoder 160 to reset the count in up/down counter to a predetermined value such as, for example, "01111" or "10000" or some other initial value. Once the flip signal is set to, for example, a logic 1, a flipped DCC search, as discussed above, is initiated to determine the flipped CODE using the iterative process of detecting distortions in the duty cycle of clkF 124, updating the flipped CODE, and adjusting the duty cycle of the input clock signal 102 based on the flipped CODE until the DcdResult 154 signal starts to dither, as discussed above. During the iterative process of the flipped DCC search, based on the value of the inverted DcdResult 154 signal, the up/down counter 210 is incremented or decremented in a manner similar to the initial mode of operation.

During the iterative process of the flipped DCC search, the Int DCC Lock signal is connected to the transfer T input of the flipped code storage 230 and the flip signal is connected to the operate input O. With the DCC circuit 110 in the flipped mode, the flip signal is at, for example, a logic 1. The logic 1 of the flip signal is transmitted to the operate input O to enable operation of the of the flipped code storage 230. In addition, the initial code storage 220 is disabled because the flip signal is at a logic 0 at the operate input O of initial code storage 220 due to the inverter 225. When the dither condition occurs on the DcdResult 154 signal for the flipped DCC search, the Int DCC Lock is set to, for example, a logic 1 to lock in the flipped CODE by enabling transfer of the flipped CODE in the up/down counter 210 to the flipped code storage 230 via input D.

After the flipped CODE has been transferred to the flipped code storage 230, the Final DCC Lock is set to, for example, a logic 1, and sent to input O on the code averaging circuit 240 to enable operation of the code averaging circuit 240.

Once enabled, the code averaging circuit 240 receives the initial CODE value at input D1 from initial code storage 220 and the flipped CODE value at input D2 from the flipped code storage 230. The code averaging circuit 240 then averages the values received from the D1 and D2 inputs to get the average CODE (average CODE=(initial CODE+ flipped CODE)/2). The average CODE is then sent to input D2 of the counter control logic. The average CODE is then transferred to and/or read by the DCA circuit 120 via the counter control logic 250 for use in adjusting the duty cycle of input clock 102 during in-service operation of the apparatus 100. In some embodiments, once the Final DCC lock has occurred and in-service operation has started, the DCD component 130 can be shut down or disabled to conserve power.

In conventional duty cycle correction, the code value determined by a DCC search and used by the DCA circuit will incorporate both duty cycle distortion adjustments and DCD offset adjustments (duty cycle distortion portion+the DCD offset portion). For example, if a duty cycle distortion portion corresponds to a "00011" (+3) code value and an offset portion of the DCD circuit corresponds to a "00010" (+2) code value, the final code value used in the DCA circuit in a conventional device will be "00101" (+5), which will not properly correct for the duty cycle distortions. In exemplary embodiments of the present technology, after an initial DCC search, a flipped DCC search is performed. Both the initial CODE and the flipped CODE incorporate the DCD offset portion. In the initial CODE the DCD offset portion is added to the duty cycle distortion portion (initial CODE=duty cycle distortion portion+the DCD offset portion). However, in the flipped CODE, the DCD offset portion is subtracted from the duty cycle distortion portion (flipped CODE=duty cycle distortion portion−the DCD offset portion). For example, if the DCD circuit 150 has a duty cycle distortion corresponding to "00011" (+3) and an offset portion corresponding to "00010" (+2), the flipped code value will be "00001" (+1). By averaging the two code values, the DCD offset is automatically cancelled out ((5+ 1)/2=3). Thus, the average CODE used by the DCA circuit 120 in exemplary embodiments of the present technology cancels any DCD offset in the DCD circuit 150 and corresponds only to the distortions in the duty cycle of the input clock 102. Accordingly, exemplary embodiments of the present technology eliminate and/or minimize the need for performing DCD circuit calibrations due to offsets.

Figure 6:
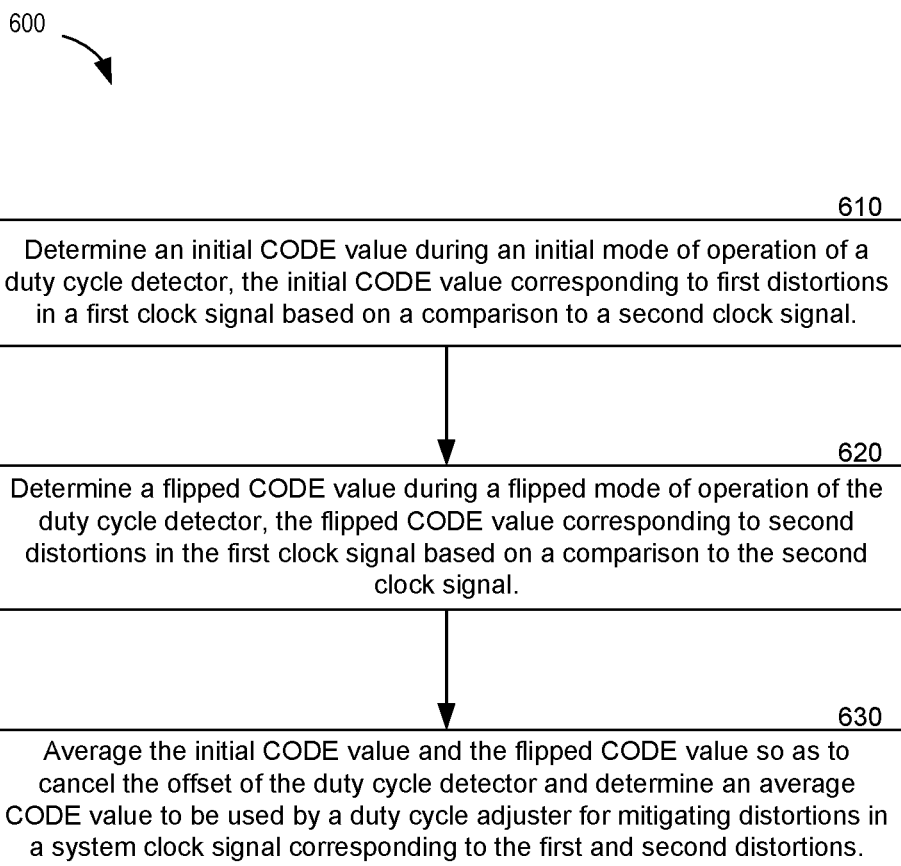
FIG. 6 is a flow diagram illustrating a method of performing duty cycle adjustment with offset correction in accordance with embodiments of the present technology.

FIG. 6 is a flow diagram illustrating example method 600 for managing offset cancellation of a duty cycle detector. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the controller 115 and DCC circuit 110 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 610, the processing device (e.g., processor 117) determines an initial CODE value during an initial mode of operation of a duty cycle detector, the initial CODE value corresponding to first distortions in a first clock signal based on a comparison to a second clock signal. In the initial mode of operation, the first clock signal corresponds to the system clock signal and the second clock signal corresponds to a signal complimentary to the system clock signal. For example, the initial CODE value can be determined based on an initial DCC search, as discussed above, which includes an iterative process of detecting distortions in the duty cycle of clock signal clkR 122 based on the complementary clock signal clkF 124, generating and/or updating the initial CODE based on the detection of the distortions, and adjusting the duty cycle based on the initial CODE until the DcdResult 154 signal starts to alternate (or dither) between "1" and "0."

At block 620, the processing device (e.g., processor 117) determines a flipped CODE value during a flipped mode of operation of the duty cycle detector, the flipped CODE value corresponding to second distortions in the first clock signal based on a comparison to the second signal. In the flipped mode of operation, the first clock signal corresponds to the signal complimentary to the system clock signal and the second clock signal corresponds to the system clock signal. For example, the flipped CODE value can be determined based on a flipped DCC search, as discussed above, which includes an iterative process of detecting distortions in the duty cycle of the complementary clock signal clkF 124 based on the clock signal clkR 122, generating and/or updating the flipped CODE based on the detection of the distortions, and adjusting the duty cycle based on the flipped CODE until an inverted DcdResult 154 signal starts to alternate (or dither) between "1" and "0."

At block 630, the processing device (e.g., processor 117) averages the initial CODE value and the flipped CODE value so as to cancel the offset of the duty cycle detector and determine an average CODE value to be used by a duty cycle adjuster for mitigating distortions in a system clock signal corresponding to the first and second distortions. For example, the average or final CODE is then used by the DCA circuit 120 to adjust the duty cycle of the input clock signal 102 to mitigate the distortions in the system clock signal 104, as discussed above.

Figure 7:
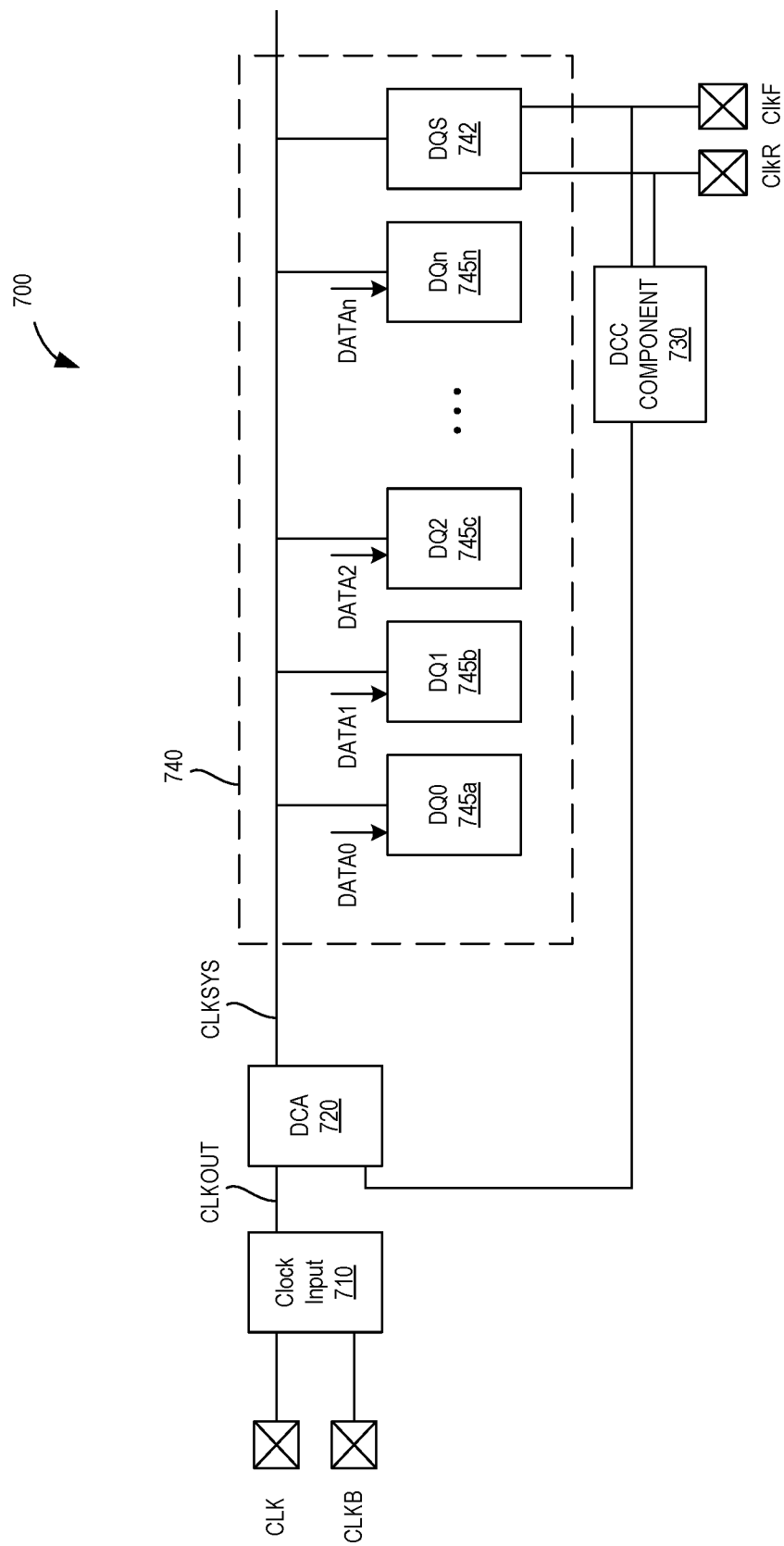
FIG. 7 is a block diagram of an apparatus in accordance with embodiments of the present technology.

FIG. 7 is a partial schematic view of an apparatus 700 in accordance with embodiments of the present technology. Any one of the foregoing embodiments or portions thereof described above with reference to FIGS. 1-5 can be incorporated into any of a myriad of larger and/or more complex systems, a representative example of which is the apparatus 700 shown schematically in FIG. 7. The apparatus 700 can be a DRAM chip such as, for example, a DDR4, DDR5, etc. The apparatus 700 generates a data strobe (DQS) along with the data (DQ) that is sent out during a memory read operation. A DQS along with its DQ information is also generates when apparatus 700 writes to memory. The apparatus 700 can include one or more DQ nodes 740 having DQ data pins 745a-n and data strobe DQS 742. The apparatus 700 includes a clock input circuit 710 which receives external clock signals CLK and CLKB and outputs clock signal CLKOUT. Clock signal CLKB can be a complementary clock to the clock signal CLK. The clock signal CLKOUT is received by DCA circuit 720, which adjusts the duty cycle of clock signal CLKOUT, and outputs a duty cycle corrected clock signal CLKSYS to the DQ node 740.

The apparatus 700 includes a DCC component 730 that detects duty cycle distortions in clock signals ClkR and ClkF of the DQS 742 because the duty cycle of the DQS 742 is considered most important with respect to the apparatus 700. However, the present technology is not limited to the detection of the duty cycle at DQS 742 and duty cycles detected at other locations can be used. The DCC component 730 receives clock signals ClkR and ClkF from the DQS 742 and performs an initial DCC search and a flipped DCC search. Based on the results of the DCC searches, the DCC component 730 generates an average code value that is transferred to and/or read by DCA circuit 720. In some embodiments, each node 740 has one or more DCA circuits 720 and DCC components 730. In some embodiments, the clock signal CLKSYS is sent to more than one node 740. In some embodiments, the DCA circuit 720 and DCC component 730 correspond to DCA circuit 120 and DCC component 130 discussed above with respect to FIGS. 1-5.

Figure 8:
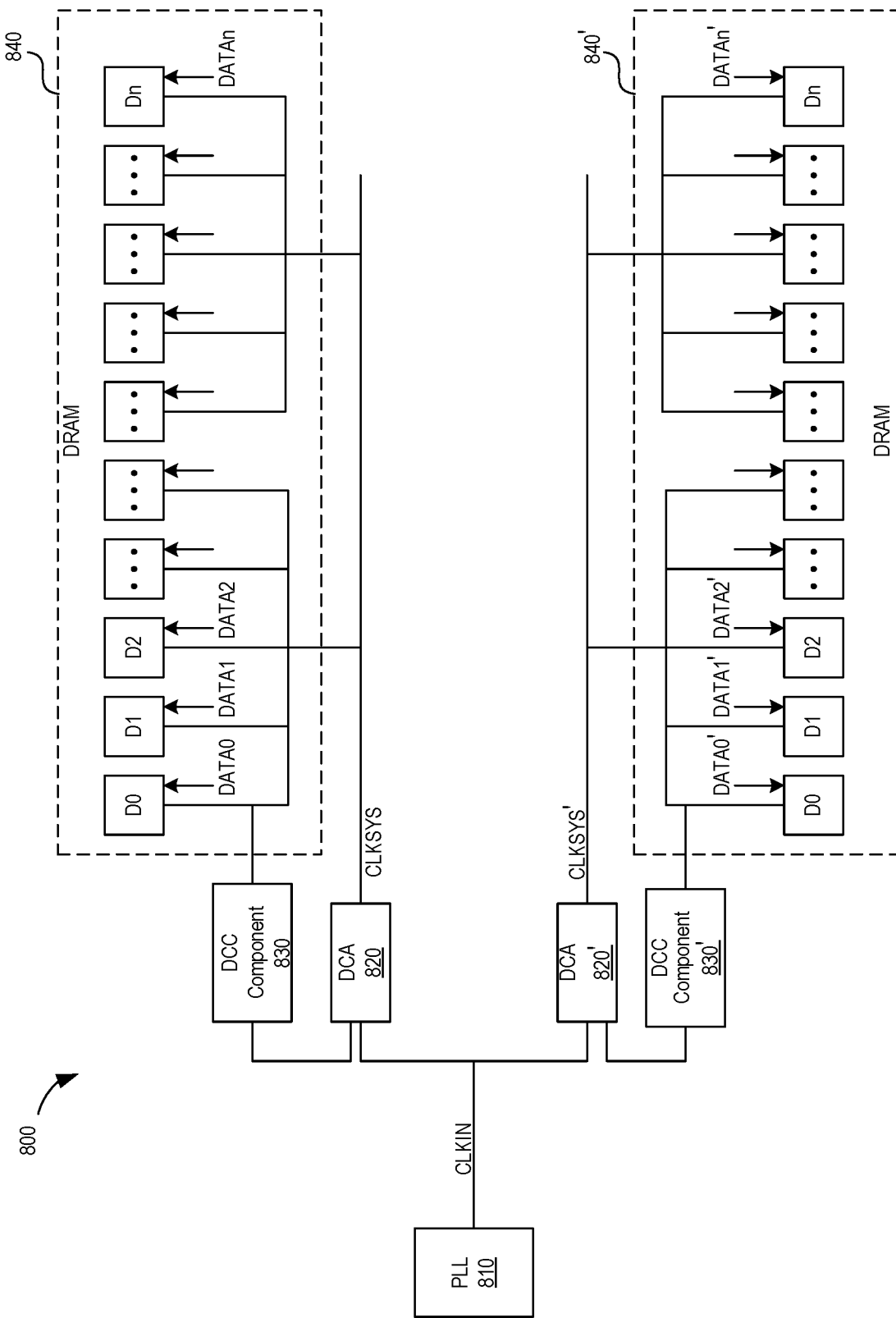
FIG. 8 is a block diagram of an apparatus in accordance with embodiments of the present technology.

FIG. 8 is a partial schematic view of an apparatus 800 in accordance with embodiments of the present technology. Any one of the foregoing embodiments or portions thereof described above with reference to FIGS. 1-5 can be incorporated into any of a myriad of larger and/or more complex systems, a representative example of which is the apparatus 800 shown schematically in FIG. 8. The apparatus 800 can be an interface chip of a high bandwidth memory (HBM) having stacked DRAM core chips. The HBM has a large number of data terminals that transfer the data in parallel. The data in the HBM device has to be latched and driven in synchronism with the clock signal. As seen in FIG. 8, the HBM interface chip includes a phase-lock loop (PLL) circuit 810 that generates an original clock signal CLKIN during the built-in self-test of the HBM interface chip. The clock signal CLKIN is provided to one or more clock paths respectively corresponding to one or more DRAM chips. As seen in FIG. 8, the clock signal CLKIN is provided to DCA circuits 820 and 820', respectively. The DCA circuits 820 and 820' respectively adjust the duty cycle of the clock signal CLKIN and output the respective clock signals CLKSYS and CLKSYS'. The clock signals CLKSYS and CLKSYS' correspond to the clock paths for the DRAM chips 840 and 840', respectively.

The electric device 800 includes DCC components 830 and 830' that detect duty cycle distortions in the respective clock paths of the DRAM chips 840 and 840'. The DCC components 830 and 830' sample the clock signals at the points DATA0 and DATA0', respectively. However, the present technology is not limited to the detection of the duty cycle at points DATA0 and DATA0' and the duty cycles can be detected at other locations. The DCC components 830 and 830' each receive complementary clock signals as discussed above. The DCC components 830 and 830' perform an initial DCC search and a flipped DCC search as discussed above. Based on the results of the DCC searches, the DCC components 830 and 830' each generate an average code value that is transferred to and/or read by respective DCA circuits 820 and 820'. In some embodiments, the DCA circuits 820 and 820' correspond to DCA circuit 120 and DCC components 830 and 830' correspond to DCC component 130, discussed above with respect to FIGS. 1-5.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

The processing device (e.g., processor 117 or other processor) represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., processor 117 or other processor) can also be one or more special-purpose processing devices such as an application specific integrated circuit (ASIC), a field programmable gate array (FPGA), a digital signal processor (DSP), network processor, or the like. The processing device (e.g., processor 117 or other processor) is configured to execute instructions for performing the operations and steps discussed herein.

The machine-readable storage medium (also known as a computer-readable medium) on which is stored one or more sets of instructions or software embodying any one or more of the methodologies or functions described herein. The machine-readable storage medium can be, for example, memory 119 or another memory device. The instructions can also reside, completely or at least partially, within another part of apparatus 100, 700, 800 (as appropriate) and/or within the processing device (e.g., processor 117 or other processor) during execution thereof by the apparatus 100, 700, 800. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. A method, comprising:
   determining an initial code value during an initial mode of operation of a duty cycle detector, the initial code value corresponding to first distortions in a first clock signal based on a comparison to a second clock signal;
   determining a flipped code value during a flipped mode of operation of the duty cycle detector, the flipped code value corresponding to second distortions in the first clock signal based on a comparison to the second clock signal;
   averaging the initial code value and the flipped code value so as to cancel the offset of the duty cycle detector and determine an average code value to be used by a duty cycle adjuster for mitigating distortions in a system clock signal corresponding to the first and second distortions,
   wherein, in the initial mode of operation, the first clock signal corresponds to the system clock signal and the second clock signal corresponds to a signal complimentary to the system clock signal, and
   wherein, in the flipped mode of operation, the first clock signal corresponds to the signal complimentary to the system clock signal and the second clock signal corresponds to the system clock signal.

2. The method of claim 1, further comprising:
   adjusting a duty cycle of an input clock signal based on the average code value to mitigate the distortions in the system clock signal,
   wherein the determining the initial code and the determining the flipped code each include determining, using the duty cycle detector circuit, a duty cycle status of whether the first clock signal is above a 50% duty cycle or below a 50% duty cycle based on a comparison of the first clock signal to the second clock signal, and
   wherein the system clock is transmitted to a clock distribution network and the first clock signal and the second clock signal are received from the clock distribution network.

3. The method of claim 2, further comprising:
   directing the system clock signal to a first input on the duty cycle detector and the complementary system clock signal to a second input on the duty cycle detector when in the initial mode of operation; and
   directing the complementary system clock signal to the first input and the system clock signal to the second input when in the flipped mode of operation.

4. The method of claim 2, wherein the determining of the initial code value includes locking in the initial code value after the duty cycle status signal reaches a dither condition between a duty cycle of the first clock signal above 50% and a duty cycle of the first clock signal below 50%, and
   wherein the determining of the flipped code value includes locking in the final code value after the duty cycle status signal reaches a dither condition between a duty cycle of the first clock signal above 50% and a duty cycle of the first clock signal below 50%.

5. The method of claim 2, wherein the initial code value further corresponds to the offset of the duty cycle detector and the flipped code value further corresponds to the offset of the duty cycle detector.

6. The method of claim 1, wherein the average code value corresponds to a bit code, and wherein the duty cycle adjustment circuit selectively operates pull-up and/or pull-down circuits based on a value of the bit code.

7. The method of claim 1, wherein the average code value is used to adjust the duty cycle of the input clock signal during in-service operations.

8. A non-transitory computer-readable storage medium comprising instructions that, when executed by a processing device, cause the processing device to:
   determine an initial code value during an initial mode of operation of a duty cycle detector, the initial code value corresponding to first distortions in a first clock signal based on a comparison to a second clock signal;
   determine a flipped code value during a flipped mode of operation of the duty cycle detector, the flipped code value corresponding to second distortions in the first clock signal based on a comparison to the second clock signal;
   average the initial code value and the flipped code value so as to cancel the offset of the duty cycle detector and determine an average code value to be used by a duty cycle adjuster for mitigating distortions in a system clock signal corresponding to the first and second distortions,
   wherein, in the initial mode of operation, the first clock signal corresponds to the system clock signal and the second clock signal corresponds to a signal complimentary to the system clock signal, and
   wherein, in the flipped mode of operation, the first clock signal corresponds to the signal complimentary to the system clock signal and the second clock signal corresponds to the system clock signal.

9. The non-transitory computer-readable storage medium of claim 8, further comprising instructions that, when executed by a processing device, cause the processing device to:
   adjust a duty cycle of an input clock signal based on the average code value to mitigate the distortions in the system clock signal,
   wherein the determining the initial code and the determining the flipped code each include determining, using the duty cycle detector circuit, a duty cycle status of whether the first clock signal is above a 50% duty cycle or below a 50% duty cycle based on a comparison of the first clock signal to the second clock signal, and
   wherein the system clock is transmitted to a clock distribution network and the first clock signal and the second clock signal are received from the clock distribution network.

10. The non-transitory computer-readable storage medium of claim 9, further comprising instructions that, when executed by a processing device, cause the processing device to:
   direct the system clock signal to a first input on the duty cycle detector and the complementary system clock signal to a second input on the duty cycle detector when in the initial mode of operation; and
   direct the complementary system clock signal to the first input and the system clock signal to the second input when in the flipped mode of operation.

11. The non-transitory computer-readable storage medium of claim 9, wherein the determining of the initial code value includes locking in the initial code value after the duty cycle status signal reaches a dither condition between a duty cycle of the first clock signal above 50% and a duty cycle of the first clock signal below 50%, and
   wherein the determining of the flipped code value includes locking in the final code value after the duty cycle status signal reaches a dither condition between a duty cycle of the first clock signal above 50% and a duty cycle of the first clock signal below 50%.

12. The non-transitory computer-readable storage medium of claim 9, wherein the initial code value further corresponds to the offset of the duty cycle detector and the flipped code value further corresponds to the offset of the duty cycle detector.

13. The non-transitory computer-readable storage medium of claim 8, wherein the average code value corresponds to a bit code, and
   wherein the duty cycle adjustment circuit selectively operates pull-up and/or pull-down circuits based on a value of the bit code.

14. The method of claim 2, wherein the average code value corresponds to a bit code, and
   wherein the adjusting of the duty cycle selectively operates pull-up circuits, pull-down circuits or both pull-up circuit and pull-down circuits based on a value of the bit code.

15. The apparatus of claim 2, wherein the average code value is used in the adjusting of the duty cycle during in-service operations.

16. The non-transitory computer-readable storage medium of claim 9, wherein the average code value corresponds to a bit code, and
   wherein the adjusting of the duty cycle selectively operates pull-up circuits, pull-down circuits or both pull-up circuit and pull-down circuits based on a value of the bit code.

17. The non-transitory computer-readable storage medium of claim 9, wherein the average code value is used in the adjusting of the duty cycle during in-service operations.

* * * * *